(12) United States Patent
Hanawa et al.

(10) Patent No.: US 8,970,226 B2
(45) Date of Patent: Mar. 3, 2015

(54) IN-SITU VHF CURRENT SENSOR FOR A PLASMA REACTOR

(71) Applicant: Applied Materials, Inc., Santa Clara, CA (US)

(72) Inventors: Hiroji Hanawa, Sunnyvale, CA (US); Satoru Kobayashi, Santa Clara, CA (US); Kartik Ramaswamy, San Jose, CA (US); Shahid Rauf, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 110 days.

(21) Appl. No.: 13/944,026

(22) Filed: Jul. 17, 2013

(65) Prior Publication Data

US 2013/0320998 A1    Dec. 5, 2013

Related U.S. Application Data

(62) Division of application No. 13/052,280, filed on Mar. 21, 2011, now Pat. No. 8,513,939.

(60) Provisional application No. 61/392,121, filed on Oct. 12, 2010.

(51) Int. Cl.
*G01R 27/26* (2006.01)
*G01R 25/02* (2006.01)
*G01R 15/18* (2006.01)
*G01R 27/32* (2006.01)
*G01R 19/00* (2006.01)
*H05H 1/00* (2006.01)

(52) U.S. Cl.
CPC ............ *G01R 27/32* (2013.01); *G01R 19/0061* (2013.01); *H05H 1/0081* (2013.01)
USPC .............................. 324/654; 324/95; 324/127

(58) Field of Classification Search
CPC .... G01R 27/32; G01R 19/0061; G01R 15/18; H05H 1/0081
USPC ............................................ 324/654, 95, 127
See application file for complete search history.

(56) References Cited

U.S. PATENT DOCUMENTS

| 5,565,737 | A | * | 10/1996 | Keane ...................... 315/111.21 |
| 2004/0021454 | A1 |   | 2/2004 | Jevtic et al. |
| 2006/0084397 | A1 |   | 4/2006 | Turner et al. |
| 2009/0256580 | A1 | * | 10/2009 | Heckleman et al. .......... 324/654 |
| 2012/0086464 | A1 |   | 4/2012 | Hanawa et al. |

* cited by examiner

*Primary Examiner* — Amy He
(74) *Attorney, Agent, or Firm* — Robert M. Wallace

(57) ABSTRACT

An RF current probe is encapsulated in a conductive housing to permit its placement inside a plasma reactor chamber. An RF voltage probe is adapted to have a long coaxial cable to permit a measuring device to be connected remotely from the probe without distorting the voltage measurement.

20 Claims, 3 Drawing Sheets

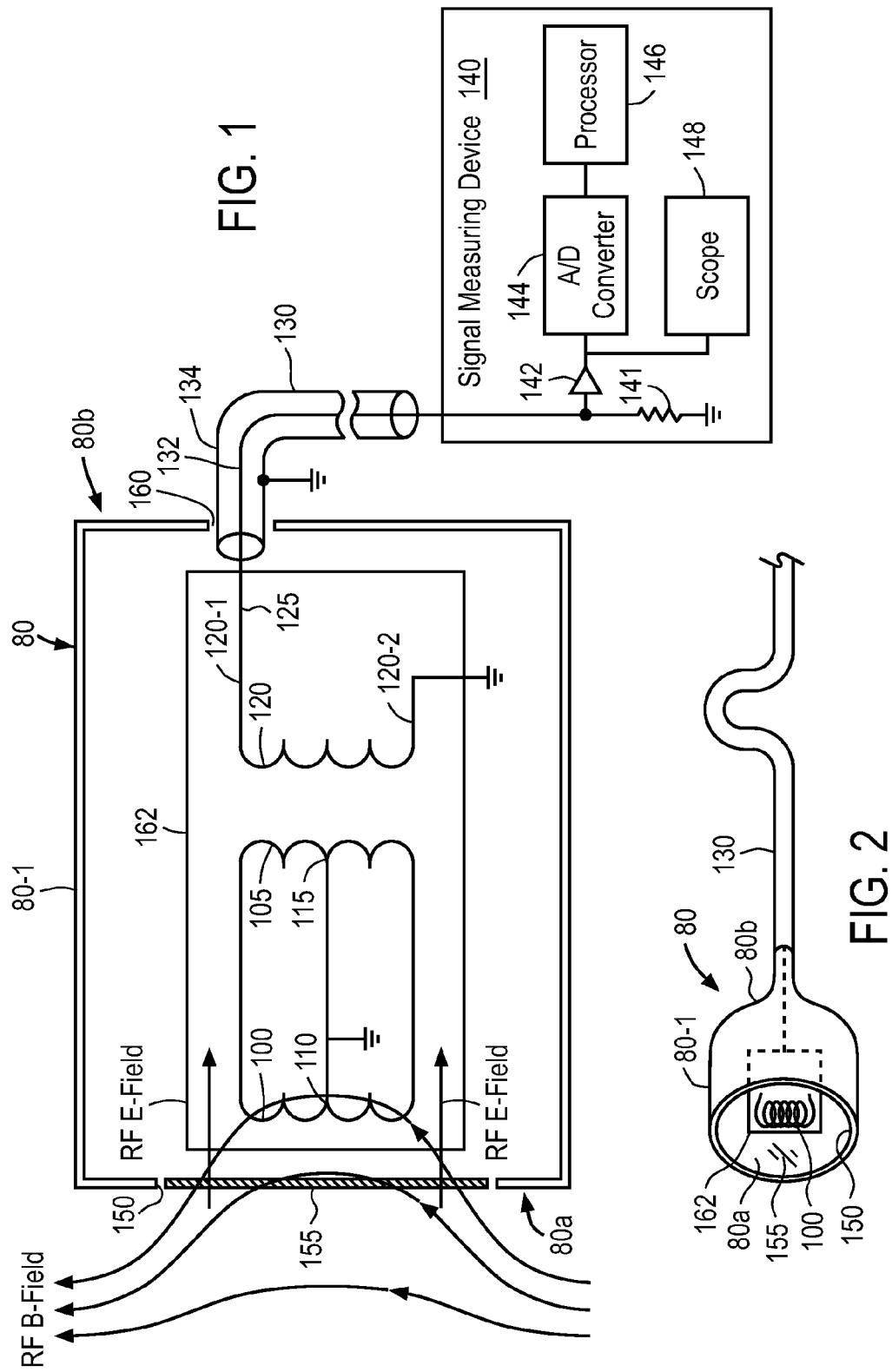

ness (VHF) range from 30
IN-SITU VHF CURRENT SENSOR FOR A PLASMA REACTOR

CROSS-REFERENCE TO RELATED APPLICATIONS

This application is a divisional of U.S. application Ser. No. 13/052,280 filed Mar. 21, 2011 entitled IN-SITU VHF VOLTAGE SENSORS FOR A PLASMA REACTOR, by Hiroji Hanawa et al., which claims the benefit of U.S. Provisional Application Ser. No. 61/392,121, filed Oct. 12, 2010 entitled IN-SITU VHF VOLTAGE/CURRENT SENSORS FOR A PLASMA REACTOR, by Hiroji Hanawa, et al.

BACKGROUND

Accurate real-time measurements of RF voltage and RF current at selected locations in a plasma reactor are highly sought after, in the processing of workpieces such a semiconductor substrate or wafer. The RF frequencies involved in such measurements depend upon the type of plasma reactor, and may lie in the very high frequency (VHF) range from 30 MHz to 300 MHz, for example, or any other RF frequency range. Such measurements are essential for process control, tool maintenance and process design in semiconductor product fabrication of ultra large scale integrated circuits, solar panels, plasma displays, photolithographic masks, and the like. Processes in which such measurements are needed include reactive ion etching of dielectric materials, conductive or semi-conductive materials and organic materials such as photoresist. Other processes where such measurements are needed include plasma-enhanced chemical vapor deposition, plasma-enhanced physical vapor deposition, and the like.

Such measurements may be accomplished using an RF current probe. An RF current probe typically includes a pick-up coil connected across a primary winding. A secondary winding provides an output voltage representative of the measured RF current near the pick-up coil. The RF current probe includes or is coupled to a signal measuring device. The signal measuring device is connected across the secondary winding. Such a signal measuring device may include signal-conditioning or analog-to-digital converter circuits, for example. Alternatively, or in addition, the signal measuring device may include an oscilloscope. The probe cannot be placed inside the plasma reactor chamber without compromising or damaging its components from exposure to plasma during processing. Therefore, permanent location of such an RF current probe is typically confined to locations outside of the chamber or on exterior chamber surfaces.

Alternatively or in addition, such measurements may be accomplished using an RF voltage probe. An RF voltage probe includes a floating electrode serving as a conductive sensor head connected to a passive network of capacitors, that is, a capacitive voltage divider network. The capacitive voltage divider network is connected at an output node to a signal measuring device. Such a signal measuring device may include signal-conditioning or analog-to-digital converter circuits, for example. Alternatively, or in addition, the signal measuring device may include an oscilloscope. The voltage of the sensor head reflects the local RF electric field near the sensor head, as desired. Unfortunately, it is highly sensitive to the load impedance of the signal measuring device and of the signal path (e.g., a cable) connected from the output node to the signal measuring device. In order to avoid distortion of the measured voltage due to the load impedance of the signal path, the measuring device must be placed very close to (e.g., next to) the capacitive voltage divider network, to minimize the signal path length. Typically, the capacitive voltage divider network is sufficiently close to the conductive sensor head so that they separated by less than centimeter. The measuring device and the capacitive voltage divider network typically may be within two centimeters of one another, to minimize the signal path length and thereby minimize the distortion of the voltage on the sensor head. Distortion arises because the scope end of the coaxial cable is best terminated in a 50 Ohm termination resistor to avoid reflection of the RF signal at this end of the cable. This set up renders the input impedance of the coaxial cable so low as to distort the voltage on the sensor head. Therefore, the combination of the voltage probe and the measuring device constitute an assembly that is not separable. Unfortunately, the measuring device adds such bulk to the entire assembly. As a result, the RF voltage probe and assembly (including the measuring device) cannot be placed inside the plasma reactor chamber. Thus, there has seemed to be no way in which to obtain precise accurate RF measurements inside a plasma reactor chamber.

SUMMARY

In accordance with one embodiment, an RF voltage probe has a coaxial cable and a circuit including a sensor head or conductive electrode, an output terminal along with an amplifier having very high input impedance and a very low output impedance near the characteristic impedance of said coaxial cable. The said sensor head is coupled to said input of said amplifier, and said output of said amplifier is coupled to said inner conductor of said coaxial cable. The circuit is contained within a conductive housing, said conductive housing having a front opening facing said conductive electrode, an RF-transparent window covering said front opening, and a rear opening receiving the near end of the coaxial cable. The remote end of the coaxial cable may be connected to a remote measuring device. The outer conductor of said coaxial cable is in electrical contact with said conductive housing.

In accordance with another embodiment, an RF current probe has a coaxial cable including an inner conductor and a cylindrical outer conductor and a circuit including a pick-up coil with a first center tap, a primary winding connected across said pick-up coil and having a second center tap connected to said first center tap, and a secondary winding having one end connected to said inner conductor and an opposite end coupled to said outer conductor. The circuit is contain in a conductive housing comprising a front opening facing said pick-up coil, an RF-transparent window covering said front opening, and a rear opening. The coaxial cable has a near end extending into said rear opening, and a remote end connectable to a measuring device, said outer conductor of said coaxial cable being in electrical contact with said conductive housing.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 1 is a diagram depicting an RF current probe in accordance with one embodiment.

FIG. 2 depicts a perspective view of a housing assembly of the probe of FIG. 1.

Figure 3A:
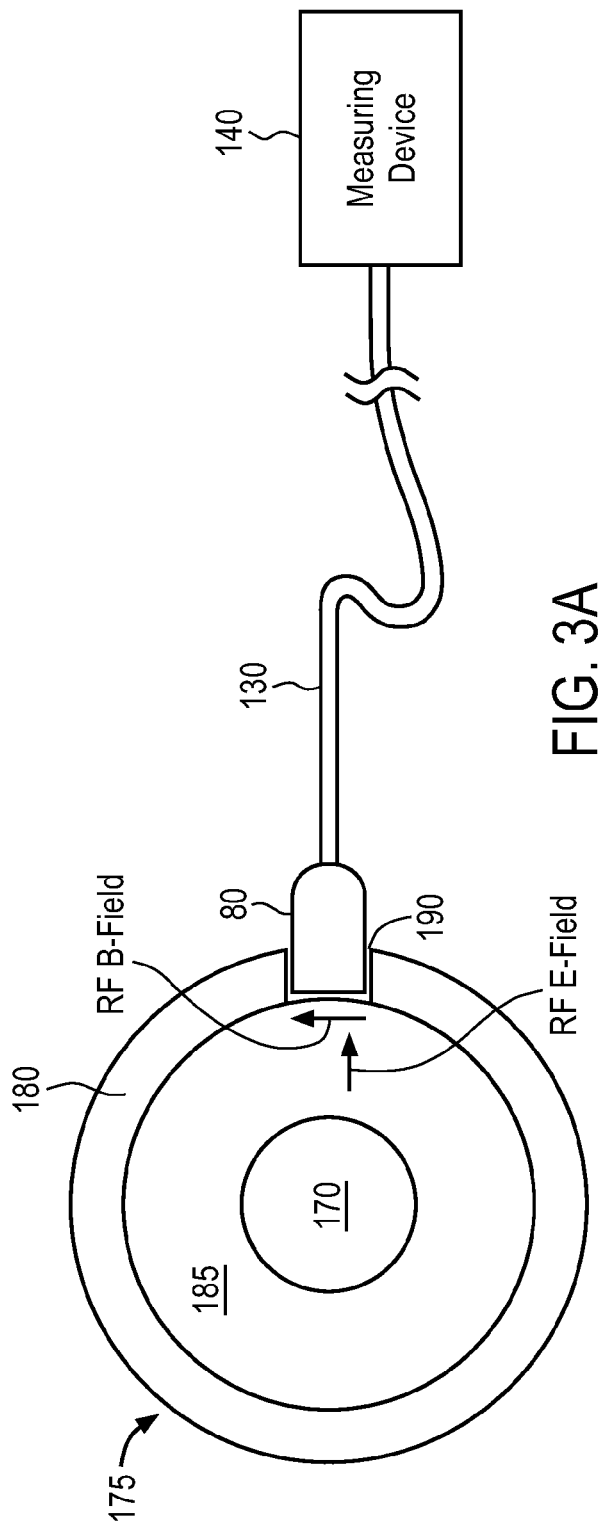
FIGS. 3A and 3B depict use of the probe of FIGS. 1 and 2 to measure RF current flowing through an RF coaxial conductor.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

FIG. 1 illustrates an RF current probe in accordance with one embodiment. The probe is contained in a metal housing 80 and includes a pick-up coil 100 and a primary winding 105 connected across the pick-up coil 100. The pick-up coil 100 has a center tap 110 connected to ground and the primary winding 105 has a center tap 115 connected to ground. The grounded center taps 110, 115 promote common mode suppression of RF electric field effects. A secondary winding 120 is inductively coupled to the primary winding 105 and has a first end 120-1 connected to an output node 125, and a second end 120-2 that is connected to ground. A coaxial cable 130 has a center conductor 132 connected at one end to the output node 125 and an outer conductor 134 connected to ground. A signal measuring device 140 is connected to the opposite end of the coaxial cable 130, at which the coaxial cable 130 may be terminated in a termination resistor 141, such as a 50 Ohm resistor. As depicted in FIG. 1, the signal measuring device 140 includes signal processing or conditioning devices such as a signal conditioner 142, an analog-to-digital converter 144 and a processor 146. The measuring device 140 may include, in addition or alternatively, an oscilloscope 148.

The metal housing 80 may be of any suitable shape. A round shape may be preferable for use in an environment with a high RF electrical field. However, as depicted in FIG. 2, the metal housing 80 may be cylindrical in shape as defined by a cylindrical side wall 80-1, and may be only a few centimeters in length and diameter. Referring again to FIG. 1, the housing 80 includes at its front end 80a a sensor opening 150 adjacent the pick-up coil 100. The sensor opening 150 may be concentric with the cylindrical housing 80. The sensor opening 150 is covered by a layer of material forming a window 155 that is transparent to electromagnetic radiation, such a high temperature glass material or the like. The housing further includes at its back end 80b an opening 160 for access by the coaxial cable 130. The housing 80 may be grounded and connected to the outer conductor 134 of the coaxial cable 130. For example, the edge of the opening 160 may be electrically connected to the outer conductor 134 of the coaxial cable 130. As shown in FIG. 2, the back end 80b of the housing 80 may be tapered or conical in shape.

The probe circuitry including the pick-up coil 100, the primary and secondary windings 105, 120 and the output node 125 may be implemented as an integrated circuit, printed circuit board or surface mount structure or a combination of any of these or similar implementations. For example, the probe circuitry 100, 105, 120, 125 may be implemented on a single substrate 162 as an integrated circuit, printed circuit board or surface mount device. The substrate 162 may be planar and fit inside the housing 80 in the manner depicted in FIG. 2, with the pick-up coil 100 being adjacent the window RF-transparent 155.

Figure 3B:
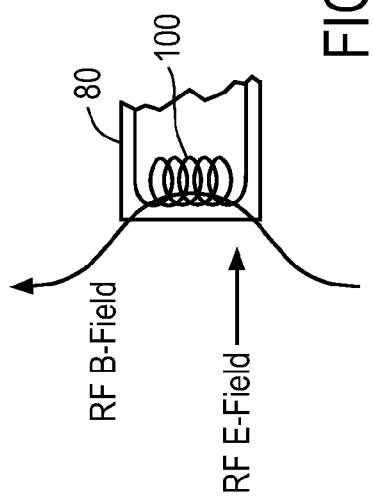

FIGS. 3A and 3B illustrate how to measure RF current in a component of a plasma processing reactor chamber, such as a coaxial cable 175. The coaxial cable 175 has a center conductor 170, an outer conductor 180 and an interior dielectric sleeve 185 separating the inner and outer conductors 170, 180. For purposes of the measurement, an opening 190 is formed in the outer conductor 180 adjacent the probe's RF-transparent window 155, exposing a small portion of the interior dielectric sleeve in the vicinity of the probe's RF-transparent window 155. The probe housing 80 is inserted toward (or partially into) the opening 190. The RF-transparent window 155 may be adjacent or contacting the exposed outer surface of the dielectric sleeve 185. The sensor head 100 is thereby inductively coupled to the inner coaxial conductor 170 through the interior dielectric sleeve 185. As depicted in FIG. 3B, the RF magnetic field of the coaxial cable 175 is parallel to the axis of the pick-up coil 100. The RF E-field is perpendicular to the coil axis.

Preferably, the RF current probe of FIGS. 1 and 2 is placed outside the vacuum chamber of an RF plasma reactor and operated at atmospheric pressure. However, the housing 80 may be hermetically sealed to allow the probe to be used inside the vacuum chamber. The grounded conductive housing 80 enables the RF voltage probe of FIG. 1 to be inserted into the interior of a plasma reactor chamber during processing by protecting the probe circuitry 160 from the effects of exposure to plasma.

Figure 4:
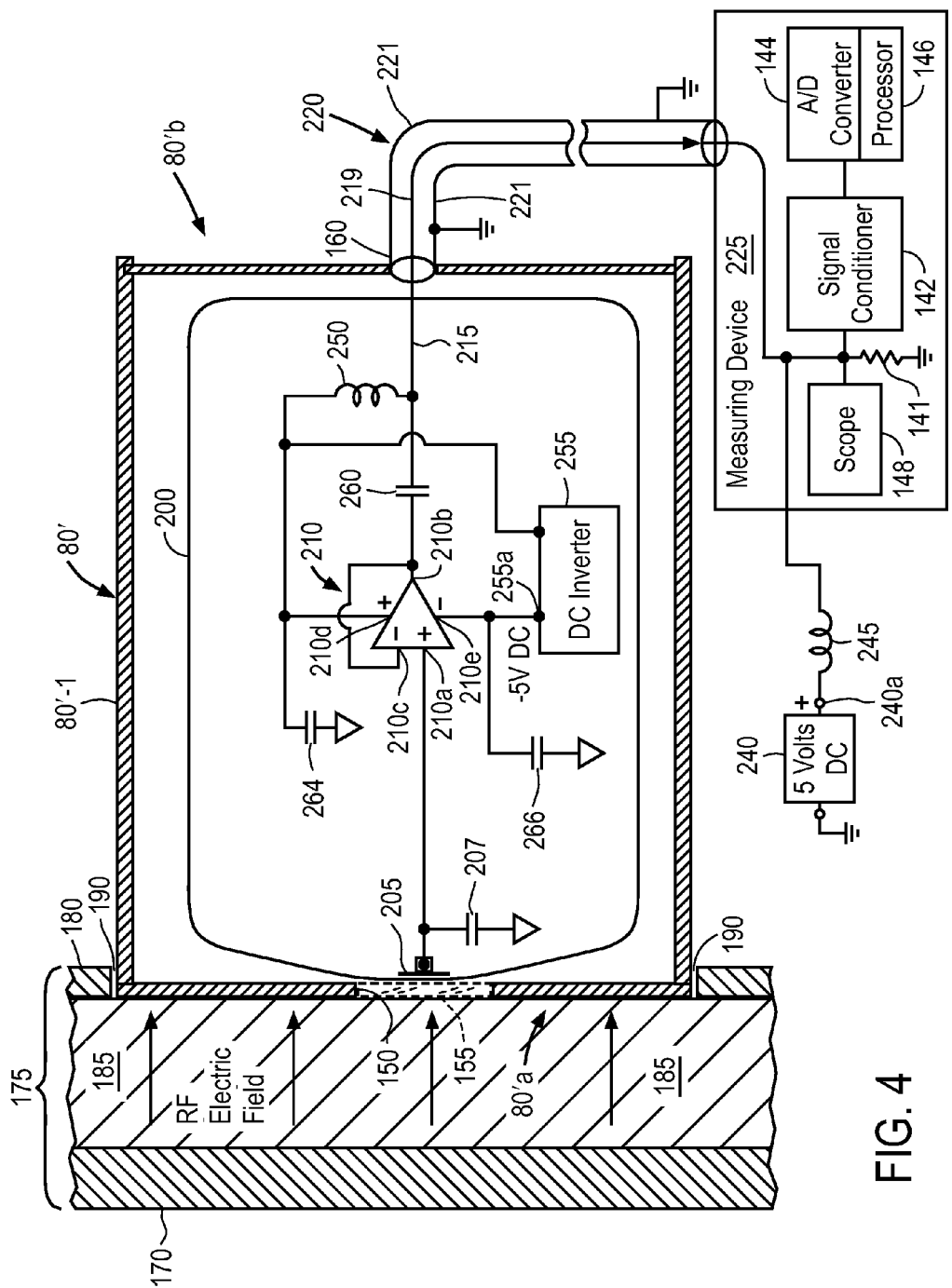
FIG. 4 is a diagram depicting an RF voltage probe in accordance with another embodiment.

FIG. 4 illustrates a voltage probe in accordance with another embodiment. The voltage probe of FIG. 3 is implemented as a circuit 200 implemented as a substrate within a metal housing 80' similar to the housing 80 of FIG. 2. The circuit 200 includes a floating electrode embodied within a sensor head 205, a capacitive voltage divider network adjacent the sensor head 205 and consisting of at least one voltage divider capacitor 207 connected between the sensor head 205 and the housing 80' (or RF ground). The circuit 200 further includes an impedance transformation buffer 210 having an input connected to the sensor head 205. The output of the impedance transformation buffer 210 is connected at an output node 215 to the center conductor 219 of a long external coaxial cable 220. The coaxial cable 220 has an outer conductor 221 connected to the metal housing 80'. The opposite end of the coaxial cable 220 is coupled to a remote measuring device 225. The coaxial cable 220 is sufficiently long so that, in the case in which the probe housing 80' is located on the interior side of a reactor chamber wall, the coaxial cable 220 may pass through an opening in the chamber wall to reach the remote measuring device 225, which may be located at any convenient location external of the chamber regardless of distance without loading the sensor head 205 or distorting the RF voltage measurement. This ability to tolerate such a long signal path is made possible by the high input impedance of the impedance transformation buffer 210, which will be discussed in greater detail below.

In order to prevent the relatively low impedance of the long coaxial cable 220 from loading the sensor head 205 or distorting the voltage sensed at the sensor head 205, the impedance transformation buffer 210 presents a very high load impedance to the sensor head 205 on the order of hundreds of 100 MegaOhms to GigaOhms (or greater). At the same time, the impedance transformation buffer 210 presents a very low input impedance to the coaxial cable 220 (e.g., within a factor of ten of the characteristic impedance of the coaxial cable 220). The advantage of such a high load impedance on the sensor head 205 presented by the impedance transformation buffer 210 is that the coaxial cable 220 and the measuring device 225 do not draw current from or otherwise load the sensor head 205, and therefore do not distort the RF voltage sensed by the sensor head 205.

The impedance transformation buffer may be realized as an operational amplifier or a differential amplifier. In one example, the impedance transformation buffer 210 was realized as a differential amplifier having unity gain. Hereinafter, the impedance transformation buffer 210 may be referred to as a differential amplifier. Any suitable combination of amplifiers with suitable gain may be employed as long as the input impedance is kept high. In the illustrated example, the sensor head 205 is connected to the positive differential amplifier input 210a, and feedback from output 210b of the differential amplifier 210 is connected as feedback to the negative differential amplifier input 210c. Alternatively, a differential amplifier consisting of two or three operational amplifiers with a high input impedance can be adopted, in which its positive and negative inputs are connected to the sensor head 205 and the housing 80', respectively In order to provide the required positive and negative bias voltages to operate the impedance transformation buffer or differential amplifier 210, an external 5-volt D.C. power supply 240 outside of the housing 80' has its +5 volt DC output node 240a coupled through an RF suppression or choke inductor 245 to the coaxial cable center conductor 219. The negative or D.C. return terminal of the D.C. power supply 240 is connected to the coaxial cable outer conductor 221 or to ground. In this way, a +5 volt DC bias voltage is available on the substrate or circuit 200 from the D.C. power supply 240 via the cable center conductor 219 and via the output node 215. This +5 volt DC bias voltage is coupled to a positive bias voltage supply terminal 210d of the differential amplifier 210 through an RF-choke inductor 250. The RF-choke inductor 250 is connected between the output node 215 and the supply terminal 210d. The +5 volt D.C. bias voltage (received through the choke inductor 250) is also coupled to a D.C. inverter 255. The D.C. inverter 255 has a −5 volt DC output 255a connected to a negative 5 volt DC bias voltage supply terminal 210e of the differential amplifier 210. A high pass D.C.-blocking capacitor 260 prevents the D.C. voltage superimposed on the inner coaxial cable conductor 219 from reaching the differential amplifier 210 or the sensor head 205.

A ripple suppression capacitor 264 is connected between the differential amplifier positive bias supply terminal 210d and ground. Another ripple suppression capacitor 266 is connected between the differential amplifier negative bias supply terminal 210e and ground. The combination of the RF choke inductor 250 and the ripple suppression capacitors 264, 266 prevents or minimizes coupling of RF voltage on the coaxial center conductor 219 to the D.C. power supplied to the differential amplifier 210.

The impedance transformation buffer 210 may be implemented using an operational amplifier having a broad band response, or a 3 dB roll-off bandwidth of 200 MHz or more, and having a high input impedance (100 MegaOhms to GigaOhms or above) and a low output impedance (within a factor of ten of 50 Ohms). The impedances referred to here are the magnitude of the complex impedance.

As depicted in FIG. 4, the far end of the coaxial cable 220 is connected to a signal measuring device 225, and is terminated in a 50 Ohm termination resistor 141. The signal measuring device 225 includes signal processing or conditioning devices such as a signal conditioner 142, an analog-to-digital converter 144 and a processor 146. The measuring device 140 may include, in addition or alternatively, an oscilloscope 148.

The metal housing 80' may be of any suitable shape. A round shape may be preferable for use in an environment with a high RF electrical field. For example, the metal housing 80' may be cylindrical in shape as defined by a cylindrical side wall 80'-1, and may be only a few centimeters in length and diameter. The housing 80' includes at its front end 80'a a sensor opening 150 adjacent the sensor head 205. The sensor opening 150 may be concentric with the cylindrical housing 80'. The sensor opening 150 is covered by a layer of material forming a window 155 that is transparent to electromagnetic radiation. The material may be a high temperature glass material or the like. The housing 80' further includes at its back end 80'b a cable opening 160 for access by the coaxial cable 220. The housing 80' may be grounded and connected to the outer conductor of the coaxial cable 220. For example, the edge of the opening 160 may electrically contact the outer conductor 221 of the cable 220. The back end 80'b of the housing 80' may be tapered or conical in shape.

FIG. 4 illustrates how to measure RF voltage in a component of a plasma processing reactor chamber, such as a coaxial cable 175. The coaxial cable 175 has a center conductor 170, an outer conductor 180 and a dielectric sleeve 185 between them. For purposes of the measurement, an opening 190 is formed in the outer conductor 180 adjacent the probe's RF-transparent window 155, exposing a small portion of the interior dielectric sleeve 185 in the vicinity of the probe's RF-transparent window 155. The probe housing 80' is inserted toward or into the opening 190. The RF-transparent window 155 may be adjacent or contacting the exposed outer surface of the dielectric sleeve 185. The sensor head 205 is thereby capacitively coupled to the inner coaxial conductor 170 through the dielectric sleeve 185.

While the foregoing is directed to embodiments of the present invention, other and further embodiments of the invention may be devised without departing from the basic scope thereof, and the scope thereof is determined by the claims that follow.

What is claimed is:

1. An RF current probe comprising:
   a coaxial cable comprising an inner conductor and an outer conductor,
   a circuit comprising:
   (a) a pick-up coil comprising a conductive winding having a first center tap,
   (b) a primary winding connected across said pick-up coil and having a second center tap connected to said first center tap, and
   (c) a secondary winding having one end connected to said inner conductor and an opposite end coupled to said outer conductor;
   a conductive housing containing said circuit, said conductive housing comprising a front opening facing said pick-up coil, an RF-transparent window covering said front opening, and a rear opening opposite said front opening;
   wherein said coaxial cable comprises: a near end extending through said rear opening, and a remote end.

2. The RF current probe of claim 1 wherein said first and second center taps are connected to RF ground.

3. The RF current probe of claim 2 wherein said conductive housing is connected to RF ground.

4. The RF current probe of claim 2 wherein said outer conductor of said coaxial cable is in electrical contact with said conductive housing.

5. The RF current probe of claim 1 wherein said conductive housing is cylindrical and coaxial with the near end of said coaxial cable.

6. The RF current probe of claim 5 wherein said front opening is coaxial with said conductive housing.

7. The RF current probe of claim 6 further comprising a termination resistor at said remote end connected between said inner and outer conductors.

8. The RF current probe of claim 7 wherein said termination resistor has a resistance of 50 Ohms.

9. The RF current probe of claim 6 wherein said coaxial cable is connectable at said remote end to a measurement device.

10. The RF current probe of claim 1 wherein said primary and secondary winding are inductively coupled to one another.

11. An RF current measurement system, comprising:
   a coaxial cable comprising an inner conductor and an outer conductor,
   a circuit comprising:
      (a) a pick-up coil comprising a conductive winding having a first center tap,
      (b) a primary winding connected across said pick-up coil and having a second center tap connected to said first center tap, and
      (c) a secondary winding having one end connected to said inner conductor and an opposite end coupled to said outer conductor;
   a conductive housing containing said circuit, said conductive housing comprising a front opening facing said pick-up coil, an RF-transparent window covering said front opening, and a rear opening opposite said front opening, wherein said coaxial cable comprises a near end extending through said rear opening, and a remote end; and
   a signal measuring device connected to said coaxial cable at said remote end.

12. The RF current measurement system of claim 11 wherein said first and second center taps are connected to RF ground.

13. The RF current measurement system of claim 12 wherein said conductive housing is connected to RF ground.

14. The RF current measurement system of claim 12 wherein said outer conductor of said coaxial cable is in electrical contact with said conductive housing.

15. The RF current measurement system of claim 11 wherein said conductive housing is cylindrical and coaxial with the near end of said coaxial cable.

16. The RF current measurement system of claim 15 wherein said front opening is coaxial with said conductive housing.

17. The RF current measurement system of claim 16 further comprising a termination resistor at said remote end connected between said inner and outer conductors.

18. The RF current measurement system of claim 17 wherein said termination resistor has a resistance of 50 Ohms.

19. The RF current measurement system of claim 16 wherein said measurement device comprises an analog-to-digital converter and a processor.

20. The RF current measurement system of claim 11 wherein said primary and secondary winding are inductively coupled to one another.

* * * * *